(12) United States Patent
Burns et al.

(10) Patent No.: US 8,656,203 B2
(45) Date of Patent: Feb. 18, 2014

(54) FRACTIONAL FREQUENCY DIVISION OR MULTIPLICATION BY USING AN OVERSAMPLED PHASE ROTATOR FOR REDUCING JITTER

(75) Inventors: Adam Burns, Oakville (CA); Dino Anthony Toffolon, Stoney Creek (CA)

(73) Assignee: Synopsys, Inc., Mountain View, CA (US)

(*) Notice: Subject to any disclaimer, the term of this patent is extended or adjusted under 35 U.S.C. 154(b) by 295 days.

(21) Appl. No.: 13/108,878

(22) Filed: May 16, 2011

(65) Prior Publication Data

US 2012/0294336 A1 Nov. 22, 2012

(51) Int. Cl.
  *G06F 1/08* (2006.01)
(52) U.S. Cl.
  USPC .......................................... 713/500
(58) Field of Classification Search
  USPC .......................................... 713/500
  See application file for complete search history.

(56) References Cited

U.S. PATENT DOCUMENTS

| | | | |
|---|---|---|---|
| 7,899,422 B1* | 3/2011 | Teo et al. | 455/258 |
| 2006/0083343 A1* | 4/2006 | Roederer et al. | 375/375 |
| 2007/0110207 A1* | 5/2007 | Chen et al. | 375/376 |
| 2010/0275037 A1* | 10/2010 | Lee et al. | 713/189 |
| 2011/0310942 A1* | 12/2011 | Flynn et al. | 375/220 |

* cited by examiner

*Primary Examiner* — Thomas Lee
*Assistant Examiner* — Danny Chan
(74) *Attorney, Agent, or Firm* — Park, Vaughan, Fleming & Dowler LLP; Laxman Sahasrabuddhe

(57) ABSTRACT

Circuits and systems for generating multiple frequencies are disclosed. In some embodiments, a circuit can include a first node, a second node, and a programmable phase rotator. The first node can receive a first signal having frequency f1, and the second node can output a second signal having frequency f2 that is different from f1. In some embodiments, a frequency divider can generate a third signal having frequency f3 based on the second signal. In some embodiments, a frequency divider can generate the first signal based on a reference signal having frequency f4. The programmable phase rotator can be capable of updating, at an update frequency that is substantially equal to f1 and/or f4, a phase difference between the first signal and the second signal. In some embodiments, the circuit can be part of a USB (Universal Serial Bus) 3.0 physical layer (PHY) circuit.

14 Claims, 6 Drawing Sheets

FRACTIONAL FREQUENCY DIVISION OR MULTIPLICATION BY USING AN OVERSAMPLED PHASE ROTATOR FOR REDUCING JITTER

TECHNICAL FIELD

This disclosure generally relates to electronic circuits. More specifically, this disclosure relates to fractional frequency division or multiplication using an oversampled phase rotator.

BACKGROUND

Related Art

Some communication systems use multiple clock frequencies that are non-integer multiples of each other. For example, a system that uses USB (Universal Serial Bus) 3.0 may need to generate clock signals at 480 MHz and 2.5 GHz.

Conventional fractional N frequency synthesizers have a number of drawbacks. Some conventional fractional N frequency synthesizers use large and complex circuits to generate multiple frequencies. For example, a phase-locked loop is usually a large and complex circuit, and a frequency synthesizer may include multiple phase-locked loops, one for each frequency that is desired to be generated.

Furthermore, because of the way they work, some frequency synthesizers introduce unacceptable amounts of jitter and/or frequency spurs in the output clock signal, and/or change the duty cycle of the clock pulses by unacceptable amounts. These drawbacks are problematic because communication standards often impose stringent timing requirements, such as low jitter and a 50/50 duty cycle, on their clocks.

SUMMARY

Some embodiments described in this disclosure feature a circuit which can be used to generate multiple clock frequencies. Specifically, some embodiments can be used to generate clock frequencies for use in a USB 3.0-based system.

In some embodiments, the circuit can include an input node, an output node, and a programmable phase rotator. The input node can receive an input signal having frequency f1, and the output node can output an output signal having frequency f2 that is different from f1. The programmable phase rotator can be capable of updating, at an update frequency that is substantially equal to f1, a phase difference between the input signal and the output signal. In some embodiments, the update frequency can be greater than f2, e.g., at least two times f2. In some embodiments, the circuit can further include a frequency divider.

In some embodiments, the frequency divider can generate the input signal based on a reference signal having frequency f4. In some embodiments, f4 can be an integer multiple of f1. In some embodiments, the programmable phase rotator can be capable of updating, at an update frequency that is substantially equal to f4, a phase difference between the input signal and the output signal. In some embodiments, the circuit can be part of a USB 3.0 physical layer (PHY) circuit.

In some embodiments, the frequency divider can generate a third signal having frequency f3 based on the output signal. In some embodiments, f3 can be an integer multiple of f2.

In some embodiments, the circuit can be included in a PLL (phase locked loop) to generate frequencies that are non-integer multiples of a given frequency. Specifically, the clock signal that is desired to be generated (i.e., the output of the PLL) can be provided as the input to the circuit, and the output of the circuit can be provided as one of the inputs to the phase detector in the PLL.

Some embodiments described in this disclosure feature a communications module that includes a receiver, a transmitter, and a clock block. The clock block can generate a clock signal that is used by the receiver and transmitter to receive and transmit data, respectively. In some embodiments, the clock block can generate the clock signal using a programmable phase rotator. In some embodiments, the communications module is a USB 3.0 interface. Some embodiments described in this disclosure feature an apparatus comprising a communications module. In this disclosure, unless otherwise stated, the term "based on" means "based solely or partly on."

DETAILED DESCRIPTION

The following description is presented to enable any person skilled in the art to make and use the embodiments described herein, and is provided in the context of a particular application and its requirements. Various modifications to the disclosed embodiments will be readily apparent to those skilled in the art, and the general principles defined herein may be applied to other embodiments and applications without departing from the spirit and scope of the embodiments described herein. Thus, the embodiments described herein are to be accorded the widest scope consistent with the principles and features disclosed herein.

Figure 1:
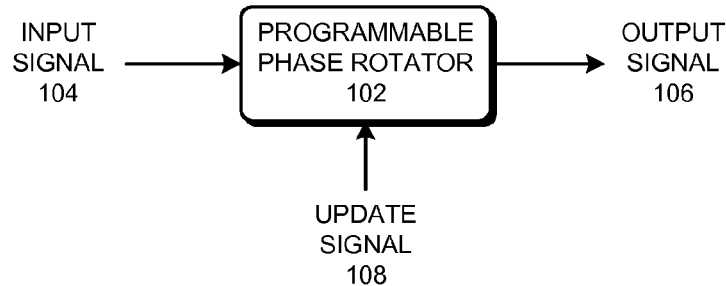
FIG. 1 illustrates a circuit in accordance with some embodiments described in this disclosure.

FIG. 1 illustrates a circuit in accordance with some embodiments described in this disclosure.

Programmable phase rotator 102 can receive input signal 104 and produce output signal 106. Programmable phase rotator 102 can be capable of updating a phase difference between input signal 104 and output signal 106 based on update signal 108. Specifically, update signal 108 can contain phase information that specifies a phase offset that programmable phase rotator 102 applies to input signal 104. The frequency of input signal 104 can be greater than or less than the frequency of output signal 106.

In some embodiments, the phase difference between input signal 104 and output signal 106 can be updated at an update frequency that is substantially equal to the frequency of input signal 104. In some embodiments, the update frequency can be greater than the frequency of the output signal, e.g., the update frequency can be at least two times the output frequency. For example, in some embodiments, input signal 104 can be a 500 MHz clock signal, output signal 106 can be a 480 MHz clock signal, and the update frequency of update signal 108 can be 2.5 GHz.

Figure 2:
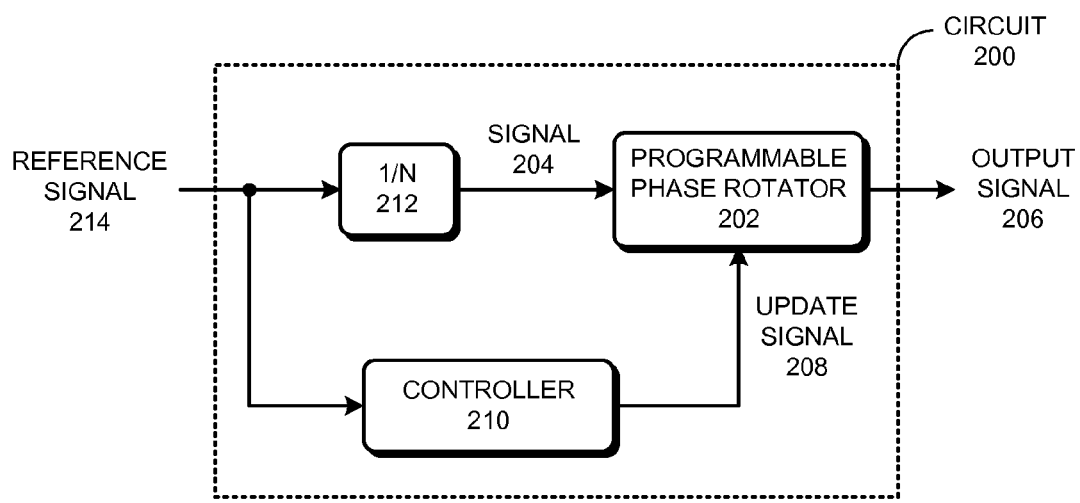
FIG. 2 illustrates a frequency synthesizer in accordance with some embodiments described in this disclosure.

FIG. 2 illustrates a frequency synthesizer in accordance with some embodiments described in this disclosure.

Circuit 200 can include 1/N frequency divider 212, controller 210, and programmable phase rotator 202. 1/N frequency divider 212 can output signal 204 based on reference signal 214. The frequency of signal 204 can be an integer sub-multiple of reference signal 214. For example, in some embodiments, the frequency of reference signal 214 can be 2.5 GHz, and the frequency of signal 204 can be 500 MHz, which is one-fifth of 2.5 GHz. Programmable phase rotator 202 can receive signal 204 as input and produce output signal 206 whose frequency is a non-integer sub-multiple of the frequency of signal 204. For example, in some embodiments, the frequency of output signal 206 can be 480 MHz and the frequency of signal 204 can be 500 MHz (note that 480 MHz is a non-integer sub-multiple of 500 MHz).

Figure 4:
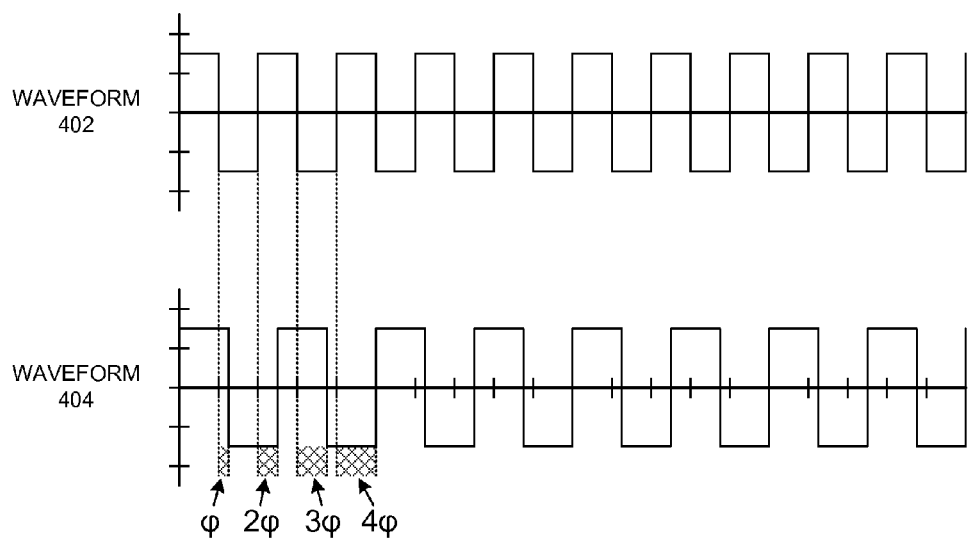
FIG. 4 presents waveforms that illustrate how a programmable phase rotator can be used to change the frequency of a signal in accordance with some embodiments described in this disclosure.

Programmable phase rotator 202 can change the phase or frequency of signal 204 based on update signal 208 which is generated by controller 210. Update signal 208 can specify the phase offset that is to be applied to signal 204. FIG. 4, described below, illustrates how a programmable phase rotator can be used to modify (increase or decrease) the frequency of a signal.

Controller 210 can be clocked using a frequency that is substantially equal to the frequency of reference signal 214 (note that the frequency of reference signal 214 is greater than the frequency of output signal 206). For example, in some embodiments, output signal 206 can be a 480 MHz clock signal and the phase of programmable phase rotator 202 can be updated at 2.5 GHz by clocking controller 210 using reference signal 214. Controller 210 can provide update signal 208 to programmable phase rotator 202 via a data bus, e.g., an n-bit data bus. The n-bit data bus can enable controller 210 to select a particular phase from $2^n$ different phases.

Figure 3:
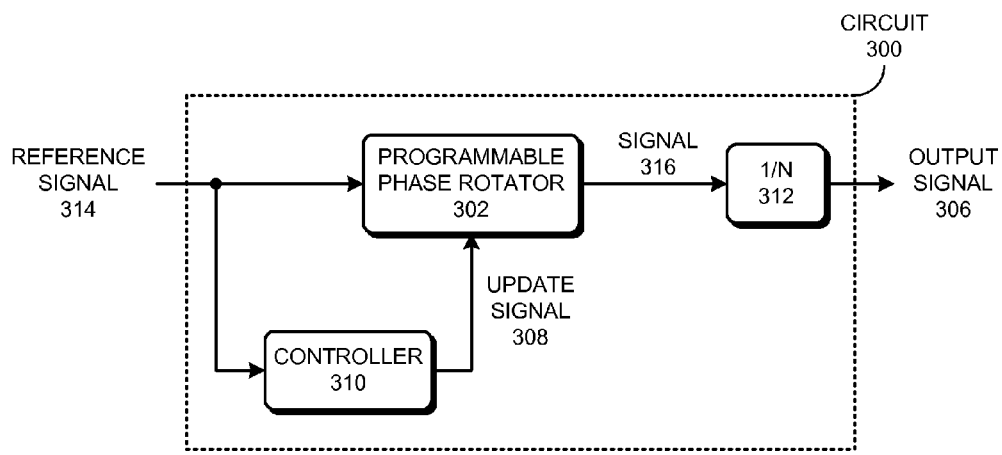
FIG. 3 illustrates a frequency synthesizer in accordance with some embodiments described in this disclosure.

FIG. 3 illustrates a frequency synthesizer in accordance with some embodiments described in this disclosure.

Circuit 300 can include 1/N frequency divider 312, controller 310, and programmable phase rotator 302. Programmable phase rotator can receive reference signal 314 and produce signal 316 whose frequency is a non-integer sub-multiple of the frequency of reference signal 314. 1/N frequency divider 312 can receive signal 316 and produce signal 306 whose frequency is an integer sub-multiple of signal 316. Programmable phase rotator 302 can change the phase or frequency of reference signal 314 based on update signal 308 which is generated by controller 310. Update signal 308 can specify the phase offset that programmable phase rotator 302 is to apply. Controller 310 can be clocked using a frequency that is greater than the frequency of output signal 306.

For example, in some embodiments, the frequency of reference signal 314 can be 2.5 GHz, the frequency of signal 316 can be 2.4 GHz, which is a non-integer sub-multiple of 2.5 GHz, and the frequency of output signal 306 can be 480 MHz, which is one-fifth of 2.4 GHz. In these embodiments, reference signal 314, which has a frequency of 2.5 GHz, can be used to clock controller 310. In other words, in these embodiments, the phase of programmable phase rotator 302 is updated at 2.5 GHz. Controller 310 can provide update signal 308 to programmable phase rotator 302 via a data bus, e.g., an n-bit data bus. The n-bit data bus can enable controller 310 to select a particular phase from $2^n$ different phases.

In some embodiments, circuit 200 or 300 can be included in a PLL (phase locked loop) to generate frequencies that are non-integer multiples of a given frequency. In some embodiments, the PLL can include a phase/frequency detector, a voltage-controlled oscillator (VCO), and a feedback path from an output of the VCO to the phase/frequency detector. In some embodiments, the output of the phase detector can be used to generate the control signal for the VCO. For example, the output of the phase detector can be fed into a charge pump, and the output of the charge pump can be provided as a control voltage to the VCO. In some embodiments, the feedback path can include circuit 200 or 300. Specifically, the output of the VCO can be provided as the input to circuit 200 or 300, and the output of circuit 200 or 300 can be provided as one of the inputs to the phase detector (the other input to the phase detector can be a reference signal).

FIG. 4 presents waveforms that illustrate how a programmable phase rotator can be used to change the frequency of a signal in accordance with some embodiments described in this disclosure.

A programmable phase rotator can apply a programmable amount of phase offset or delay to an input signal to produce an output signal that has a different phase and/or frequency. For example, waveform 402 illustrates a clock signal (e.g., input signal 104) that can be provided as an input to a programmable phase rotator (e.g., programmable phase rotator 102), and waveform 404 illustrates a clock signal that can correspond to the output signal (e.g., output signal 106) of a programmable phase rotator. Note that waveform 404 is a periodic signal that has a different period and thus a different frequency than waveform 402. In general, the frequency of the output signal can be greater than or less than the frequency of the input signal.

As shown in FIG. 4, a programmable phase rotator can increase the phase delay by $\phi$ at each clock edge of waveform 402 to produce waveform 404. The update signal can specify the phase offset or delay that the phase rotator adds to waveform 402. The phase rotator may modify the phase based on the update signal using various techniques. In some embodiments, the update signal may be inputted into an accumulator which then drives the phase rotator. In these embodiments, the update signal can provide phase changes relative to the phase value that is currently stored in the accumulator.

Note that the phase rotator can incrementally add phase to or subtract phase from a periodic signal indefinitely because the operation of adding or subtracting phase is mathematically a periodic function. In this manner, a programmable phase rotator can produce an output signal that has a different frequency from the input signal. FIG. 4 has been presented for illustration purposes only and is not intended to limit the disclosed embodiments. In general, a programmable phase rotator can be any circuit that can modify the phase of an input signal to produce an output signal whose phase and/or frequency is different from the input signal.

The output of a programmable phase rotator may have jitter. In some embodiments, the larger the normalized frequency difference between the input and the output signal of a programmable phase rotator, the larger the jitter. In some approaches, the update frequency of the phase rotator may be less than or close to the frequency of the output signal. For example, if the input frequency of the programmable phase rotator is 500 MHz and the output frequency is 480 MHz, then, in these approaches, the phase of the programmable phase rotator may be updated at 500 MHz. However, in these approaches, the amount of jitter in the output signal of the programmable phase rotator can be unacceptably large for use in certain communication systems, e.g., systems that use USB 3.0. For example, in these approaches, modifying the input signal frequency by more than 1000 ppm (parts per million) can introduce an unacceptable level of jitter in the output signal.

Figure 5:
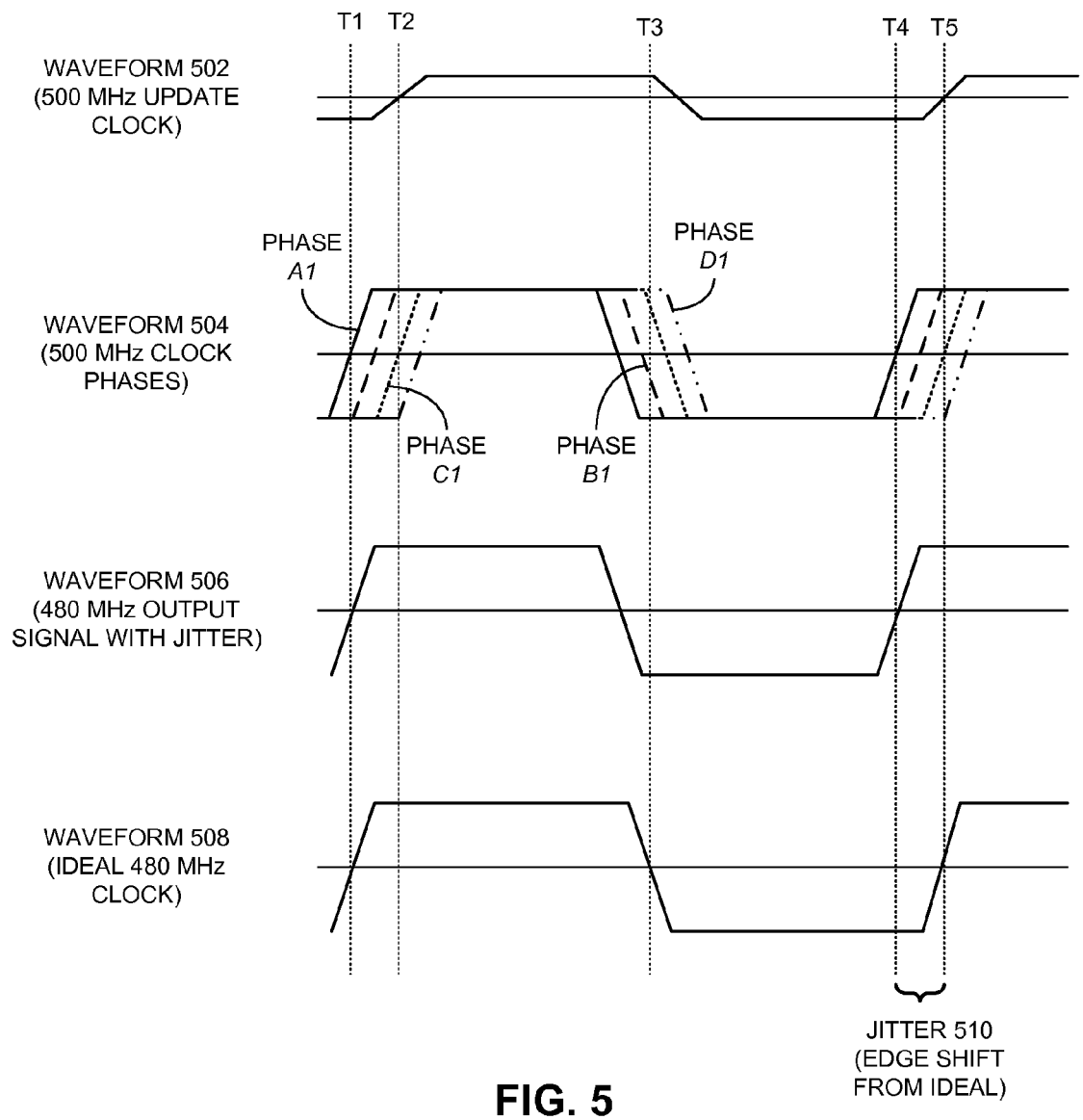
FIG. 5 illustrates waveforms for a programmable phase rotator that uses a 500 MHz update frequency in accordance with some embodiments described in this disclosure.
Figure 6:
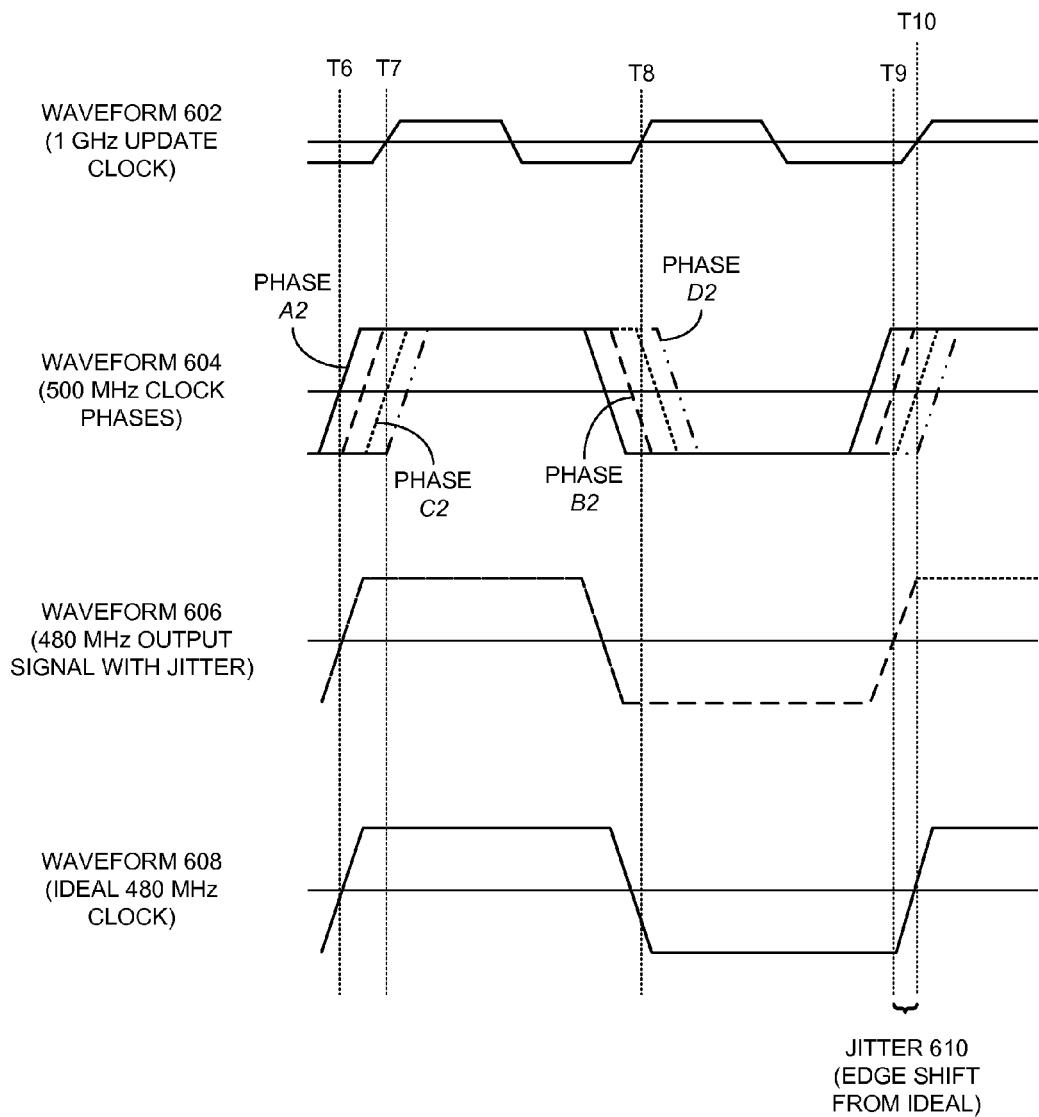
FIG. 6 illustrates waveforms for a programmable phase rotator that uses a 1 GHz update frequency in accordance with some embodiments described in this disclosure.

Some embodiments described in this disclosure are based on the following non-obvious insight: increasing the update frequency beyond the output frequency can further decrease the amount of jitter in the output signal. FIGS. 5 and 6 shown below illustrate how increasing the update frequency can reduce the amount of jitter in the output signal. Specifically, some embodiments described in this disclosure can use a programmable phase rotator to modify the input signal frequency by 40,000 ppm without introducing an unacceptable level of jitter in the output signal.

Increasing the update frequency can increase the dynamic power consumption of the circuitry (e.g., controllers 210 and 310) that generates the update signal for the programmable phase rotator. Further, it is generally costlier to design circuitry that operates at a higher frequency. At least for these reasons, it is not obvious to increase the update frequency of the programmable phase rotator. Some embodiments described in this disclosure are based on the following non-obvious insight: the benefits (e.g., reduced jitter) of increasing the update frequency outweigh the drawbacks (e.g., increased dynamic power consumption, etc.) of increasing the update frequency. Another benefit of increasing the update frequency is that it may reduce the design complexity of the programmable phase rotator. Specifically, since the amount of jitter in the output signal can be a function of the update frequency and the resolution of the programmable phase rotator, increasing the update frequency may allow for a less complex design of the programmable phase rotator (e.g., by reducing the number of bits in the data bus between the controller and the programmable phase rotator).

FIG. 5 illustrates waveforms for a programmable phase rotator that uses a 500 MHz update frequency in accordance with some embodiments described in this disclosure.

A 480 MHz clock is desired to be generated in this example. Waveform 502 can correspond to a 500 MHz clock signal that is used for updating the phase (e.g., via update signal 108 in FIG. 1) of a programmable phase rotator (e.g., programmable phase rotator 102). Waveform 504 illustrates phases A1, B1, C1, and D1 of a 500 MHz clock signal (e.g., input signal 104). Waveform 506 can correspond to the output (e.g., output signal 106) of the programmable phase rotator, which can be a 480 MHz clock signal that may include jitter. Waveform 508 can correspond to an ideal 480 MHz clock signal, i.e., a 480 MHz clock signal with substantially zero jitter.

Time T1 can correspond to the rising clock edge of the ideal 480 MHz clock signal, time T2 can correspond to the rising edge of the update clock signal, time T3 can correspond to the falling edge of the ideal 480 MHz clock, time T4 can correspond to the second rising edge of the programmable phase rotator's output signal, and time T5 can correspond to the second rising edge of the ideal clock signal.

The programmable phase rotator may be configured to update the phase at the rising edge of the update clock. For example, at time T2, the update signal may cause the programmable phase rotator to select phase A1. Next, at time T5, the update signal may cause the programmable phase rotator to select phase C1 because the rising edge of phase C1 at time T5 (see waveform 504) substantially coincides with the rising edge of the ideal clock signal (see waveform 508). However, the rising edge of phase A1 has already occurred. Therefore, when the programmable phase rotator selected phase C1 at time T5, the programmable phase rotator did not generate a rising edge that coincided with the rising edge of the ideal clock. As a result, the output of the programmable phase rotator includes jitter 510.

FIG. 6 illustrates waveforms for a programmable phase rotator that uses a 1 GHz update frequency in accordance with some embodiments described in this disclosure.

As in the previous example, a 480 MHz clock is desired to be generated. Waveform 602 can correspond to a 1 GHz clock signal that is used for updating the phase (e.g., via update signal 108 in FIG. 1) of a programmable phase rotator (e.g., programmable phase rotator 102). Waveform 604 illustrates phases A2, B2, C2, and D2 of a 500 MHz clock signal (e.g., input signal 104). Waveform 606 can correspond to the output (e.g., output signal 106) of the programmable phase rotator, which can be a 480 MHz clock signal that may include jitter. Waveform 608 can correspond to an ideal 480 MHz clock signal, i.e., a 480 MHz clock signal with substantially zero jitter.

Time T6 can correspond to the rising clock edge of the ideal 480 MHz clock signal, time T7 can correspond to the rising edge of the update clock signal, time T8 can correspond to the second rising edge of the update clock signal, time T9 can correspond to the second rising edge of the programmable phase rotator's output signal, and time T10 can correspond to the second rising edge of the ideal clock signal.

The programmable phase rotator may be configured to update the phase at the rising edge of the update clock. For example, till time T8, the programmable phase rotator may output phase A2. Next, at time T8, the update signal may cause the programmable phase rotator to select phase B2 because the falling edge of phase B2 at time T8 (see waveform 604) substantially coincides with the falling edge of the ideal clock signal (see waveform 608). However, the falling edge of phase A2 has already occurred. Therefore, when the programmable phase rotator selects phase B2 at time T8, the programmable phase rotator does not generate a falling edge that substantially coincides with the falling edge of the ideal clock. At time T10, the update signal may cause the programmable phase rotator to select phase C2 because the rising edge of phase C2 at time T10 (see waveform 604) substantially coincides with the rising edge of the ideal clock signal (see waveform 608). However, the rising edge of phase B2 has already occurred. Therefore, when the programmable phase rotator selects phase C2 at time T10, the programmable phase rotator does not generate a rising edge that substantially coincides with the rising edge of the ideal clock. As a result, the output of the programmable phase rotator includes jitter 610.

Note that jitter 610 is less than jitter 510 because the update frequency that was used in FIG. 6 is greater than the update frequency that was used in FIG. 5.

Figure 7:
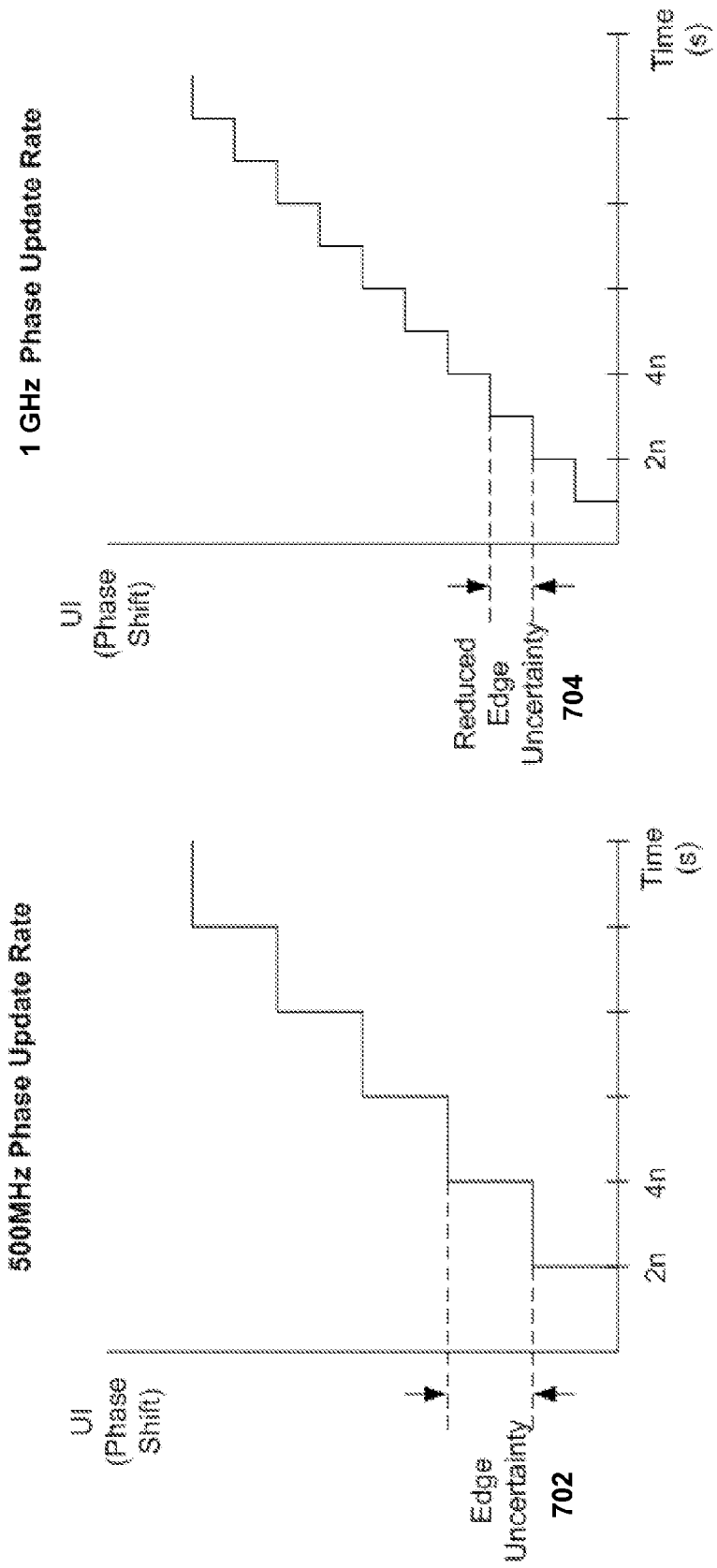
FIGS. 7A and 7B present plots of the phase shift applied by a programmable phase rotator to the input signal as a function of time in accordance with some embodiments described in this disclosure.

FIGS. 7A and 7B present plots of the phase shift (measured in Unit Interval or UI) applied by a programmable phase rotator to the input signal as a function of time in accordance with some embodiments described in this disclosure. FIGS. 7A and 7B illustrate why increasing the update frequency reduces the jitter in the output of the programmable phase rotator. The update frequencies in FIGS. 7A and 7B are 500 MHz and 1 GHz, respectively. Note that the edge uncertainty 704 in FIG. 7B is less than the edge uncertainty 702 in FIG. 7A. This causes the amount of jitter in the output signal of the programmable phase rotator to be less when the update frequency is 1 GHz instead of 500 MHz. FIGS. 7A and 7B are for illustration purposes only and are not intended to limit the scope of the disclosed embodiments.

Figure 8:
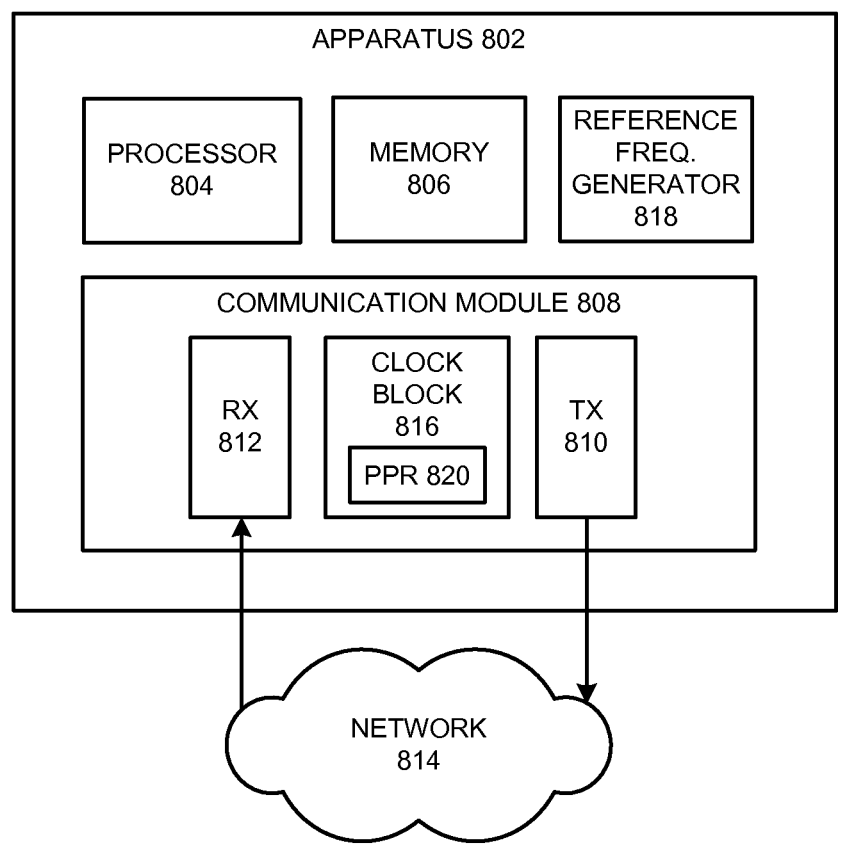
FIG. 8 illustrates an apparatus in accordance with some embodiments described in this disclosure.

FIG. 8 illustrates an apparatus in accordance with some embodiments described in this disclosure.

Apparatus 802 can comprise a plurality of mechanisms which may communicate with one another via a wired or wireless communication channel. Apparatus 802 may be realized using one or more integrated circuits, and apparatus 802 may include fewer or more mechanisms than those shown in FIG. 8. Further, apparatus 802 may be integrated in a computer system, or it may be realized as a separate device which is capable of communicating with other computer systems and/or devices. Specifically, apparatus 802 can comprise processor 804, memory 806, reference frequency generator 818, and communication module 808 that may be coupled to network 814.

During operation, processor 804 may be configured to read instructions and/or data from memory 806, and process the instructions and/or data to produce a result. Processor 804 may use communication module 808 to communicate data via a transmitter 810, and to receive data via a receiver 812.

Communication module 808 can include one or more programmable phase rotators for synthesizing one or more frequencies based on a reference frequency generated by reference frequency generator 818. In some embodiments, communication module 808 may include clock block 816 which may include circuitry for programmable phase rotator (PPR) 820. The clock signal generated by clock block 816 may be supplied to transmitter 810 and receiver 812. In some embodiments, communication module 808 is a high-speed data communication interface, e.g., a USB 3.0 interface. Specifically, the clock signal generated by clock block 816 can be used by transmitter 810 and/or receiver 812 to transmit and receive data, respectively.

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the embodiments described herein are not limited to the embodiments shown, but are to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments have been presented only for purposes of illustration and description. They are not intended to be exhaustive or to limit the embodiments to the forms disclosed. Accordingly, many modifications and variations will be apparent to practitioners skilled in the art. The scope of the claimed embodiments is defined by the appended claims.

What is claimed is:

1. A circuit for outputting a second clock signal based on a first clock signal, wherein the second clock signal has a different frequency than the first clock signal, the circuit comprising:
   a first node to receive the first signal having a first frequency;
   a second node to output the second signal based on the first signal, wherein the second signal has a second frequency that is different from the first frequency; and
   a programmable phase rotator capable of updating a phase difference between the first signal and the second signal, wherein the programmable phase rotator updates the phase difference based on an n-bit value that is received by the programmable phase rotator, and wherein the n-bit value is updated at an update frequency that is greater than the second frequency.

2. The circuit of claim 1, further comprising a frequency divider, wherein the first node corresponds to an input of the frequency divider, wherein an output of the frequency divider is provided as an input to the programmable phase rotator, and wherein the second node corresponds to an output of the programmable phase rotator.

3. The circuit of claim 1, further comprising a frequency divider, wherein the first node corresponds to an input of the programmable phase rotator, wherein an output of the programmable phase rotator is provided as an input to the frequency divider, and wherein the second node corresponds to an output of the frequency divider.

4. The circuit of claim 1, wherein the circuit is part of a Universal Serial Bus (USB) 3.0 physical layer (PHY) circuit.

5. A communications module, comprising:
   a receiver to receive data;
   a transmitter to transmit data; and
   a circuit for outputting a second clock signal based on a first clock signal, wherein the second clock signal has a different frequency than the first clock signal, the circuit comprising:
      a first node to receive the first signal having a first frequency;
      a second node to output the second signal based on the first signal, wherein the second signal has a second frequency that is different from the first frequency; and
      a programmable phase rotator capable of updating a phase difference between the first signal and the second signal, wherein the programmable phase rotator updates the phase difference based on an n-bit value that is received by the programmable phase rotator, and wherein the n-bit value is updated at an update frequency that is greater than the second frequency.

6. The communications module of claim 5, wherein the circuit further comprises a frequency divider, wherein the first node corresponds to an input of the frequency divider, wherein an output of the frequency divider is provided as an input to the programmable phase rotator, and wherein the second node corresponds to an output of the programmable phase rotator.

7. The communications module of claim 5, wherein the circuit further comprises a frequency divider, wherein the first node corresponds to an input of the programmable phase rotator, wherein an output of the programmable phase rotator is provided as an input to the frequency divider, and wherein the second node corresponds to an output of the frequency divider.

8. The communications module of claim 5, wherein the circuit is part of a Universal Serial Bus (USB) 3.0 physical layer (PHY) circuit.

9. An apparatus, comprising:
a processor;
a memory; and
a communications module, comprising:
    a receiver to receive data;
    a transmitter to transmit data; and
    a circuit for outputting a second clock signal based on a first clock signal, wherein the second clock signal has a different frequency than the first clock signal, the circuit comprising:
        a first node to receive the first signal having a first frequency;
        a second node to output the second signal based on the first signal, wherein the second signal has a second frequency that is different from the first frequency; and
        a programmable phase rotator capable of updating a phase difference between the first signal and the second signal, wherein the programmable phase rotator updates the phase difference based on an n-bit value that is received by the programmable phase rotator, and wherein the n-bit value is updated at an update frequency that is greater than the second frequency.

10. The apparatus of claim 9, wherein the circuit further comprises a frequency divider, wherein the first node corresponds to an input of the frequency divider, wherein an output of the frequency divider is provided as an input to the programmable phase rotator, and wherein the second node corresponds to an output of the programmable phase rotator.

11. The apparatus of claim 9, wherein the communications module is a Universal Serial Bus (USB) 3.0 interface.

12. A circuit for outputting a third clock signal based on a first clock signal, wherein the third clock signal has a different frequency than the first clock signal, the circuit comprising:
    a frequency divider to output a second clock signal based on the first clock signal, wherein the frequency of the first clock signal is an integral multiple of the frequency of the second clock signal;
    a programmable phase rotator to output the third clock signal based on the second clock signal, wherein the programmable rotator updates a phase difference between the second clock signal and the third clock signal, wherein the programmable phase rotator updates the phase difference based on an n-bit value that is received by the programmable phase rotator, and wherein the n-bit value is updated at an update frequency that is greater than the second frequency.

13. The circuit of claim 12, wherein the circuit is part of a Universal Serial Bus (USB) 3.0 physical layer (PHY) circuit.

14. The apparatus of claim 9, wherein the circuit further comprises a frequency divider, wherein the first node corresponds to an input of the programmable phase rotator, wherein an output of the programmable phase rotator is provided as an input to the frequency divider, and wherein the second node corresponds to an output of the frequency divider.

* * * * *